US012685039B2

(12) United States Patent
Fukushima

(10) Patent No.: US 12,685,039 B2
(45) Date of Patent: Jul. 14, 2026

(54) BONDING APPARATUS AND BONDING METHOD

(71) Applicant: Tokyo Electron Limited, Tokyo (JP)

(72) Inventor: Hideyuki Fukushima, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 687 days.

(21) Appl. No.: 18/057,935

(22) Filed: Nov. 22, 2022

(65) Prior Publication Data

US 2023/0162982 A1 May 25, 2023

(30) Foreign Application Priority Data

Nov. 25, 2021 (JP) ................................. 2021-191029

(51) Int. Cl.
 *H10P 10/00* (2026.01)
 *H10P 72/76* (2026.01)
(52) U.S. Cl.
 CPC ........ *H10P 10/128* (2026.01); *H10P 72/7604* (2026.01)
(58) Field of Classification Search
 CPC ............. H01L 21/187; H01L 21/68714; H01L 21/185; H01L 21/681; H01L 21/6838; H01L 21/68735; H01L 21/6875; H01L 21/68785; H01L 21/67092; H01L 24/74; H01L 24/80; H01L 21/67259; H01L 21/68742
 See application file for complete search history.

(56) References Cited

U.S. PATENT DOCUMENTS

| | | | |
|---|---|---|---|
| 2013/0086786 A1* | 4/2013 | Shih ................... | H01L 21/67092 |
| | | | 29/407.01 |
| 2018/0019140 A1* | 1/2018 | Inamasu ........... | H01L 21/67201 |
| 2019/0148333 A1* | 5/2019 | Chen ........................ | H01L 24/94 |
| | | | 438/16 |
| 2020/0055296 A1* | 2/2020 | Kim ................... | H01L 21/68735 |

(Continued)

FOREIGN PATENT DOCUMENTS

| | | | | |
|---|---|---|---|---|
| EP | 3742474 A1 * | 11/2020 | ........... | H01L 21/683 |
| JP | 2014-229787 A | 12/2014 | | |
| JP | 2018010925 A * | 1/2018 | ....... | H01L 21/67092 |

(Continued)

*Primary Examiner* — Mohammed Shamsuzzaman
(74) *Attorney, Agent, or Firm* — Chrisman Gallo Tochtrop LLC

(57) ABSTRACT

A bonding apparatus includes a first holder, a second holder, a moving unit, a first transforming unit, a second transforming unit and a controller. The first holder holds a first substrate from above. The second holder is provided below the first holder, and holds a second substrate from below. The moving unit moves the first holder and the second holder relative to each other. The first transforming unit makes a central portion of the first substrate held by the first holder protruded downwards. The second transforming unit makes a central portion of the second substrate held by the second holder protruded upwards. The controller performs a control of bringing the central portions into contact with each other. The controller performs a control of changing a protruding amount of the central portion of the first substrate according to a protruding amount of the central portion of the second substrate.

8 Claims, 14 Drawing Sheets

(56)                    References Cited

U.S. PATENT DOCUMENTS

2021/0272836 A1 *   9/2021   Sugakawa ......... H01L 21/67092
2024/0274462 A1 *   8/2024   Fujiwara ........... H01L 21/68714

FOREIGN PATENT DOCUMENTS

JP            6448848    B2  *  1/2019   ............. H01L 21/02
KR          20210028660  A   *  3/2021   ....... H01L 21/67028
WO    WO-2005054147  A1  *  6/2005   ....... H01L 21/76251
WO    WO-2016060274  A1  *  4/2016   ......... B23K 37/0408
WO    WO-2017115684  A1  *  7/2017   ....... H01L 21/67092
WO          2017/155002  A1      8/2018

* cited by examiner

*FIG. 8A*
*FIG. 8B*
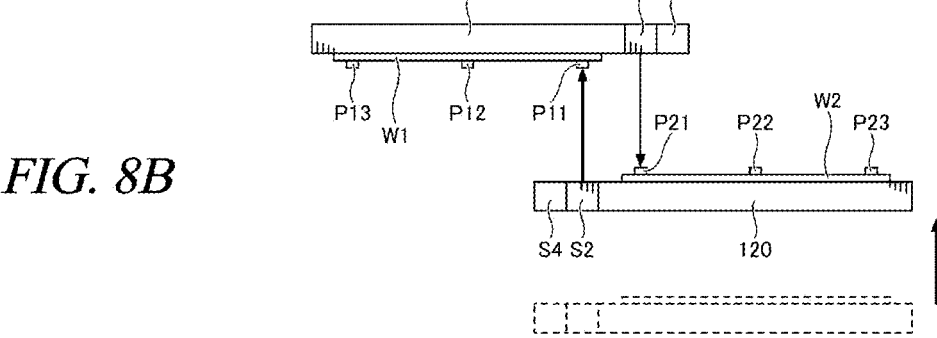
*FIG. 8C*
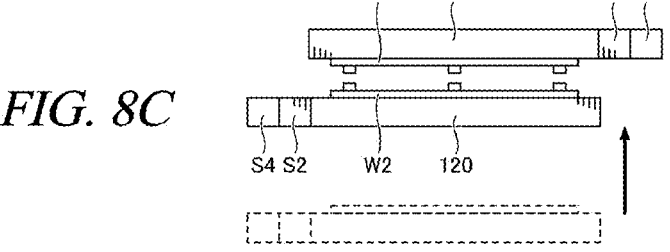

BONDING APPARATUS AND BONDING METHOD

CROSS-REFERENCE TO RELATED APPLICATION

This application claims the benefit of Japanese Patent Application No. 2021-191029 filed on Nov. 25, 2021, the entire disclosure of which is incorporated herein by reference.

TECHNICAL FIELD

The various aspects and embodiments described herein pertain generally to a bonding apparatus and a bonding method.

BACKGROUND

In a bonding apparatus described in Patent Document 1, when an upper wafer and a lower wafer are bonded, a central portion of the upper wafer is transformed downwards so that the central portion of the upper wafer and a central portion of the lower wafer come into contact with each other, and contact regions of the upper wafer and the lower wafer that are in contact with each other are enlarged from the central portions toward peripheral portions of the wafers.

Patent Document 1: Japanese Patent Laid-open Publication No. 2014-229787

SUMMARY

In one exemplary embodiment, a bonding apparatus is configured to bond a first substrate and a second substrate. The bonding apparatus includes a first holder, a second holder, a moving unit, a first transforming unit, a second transforming unit and a controller. The first holder is configured to attract and hold the first substrate from above. The second holder is provided below the first holder, and is configured to attract and hold the second substrate from below. The moving unit is configured to move the first holder and the second holder relative to each other. The first transforming unit is configured to make a central portion of the first substrate held by the first holder protruded downwards. The second transforming unit is configured to make a central portion of the second substrate held by the second holder protruded upwards. The controller is configured to control the moving unit, the first transforming unit, and the second transforming unit to perform a control of bringing the central portions of the first substrate and the second substrate into contact with each other. The controller performs a control of changing a protruding amount of the central portion of the first substrate according to a protruding amount of the central portion of the second substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8A is a side view illustrating an example of an operation in a process S112, FIG. 8B is a side view illustrating an operation following the operation of FIG. 8A, and FIG. 8C is a side view illustrating an operation following the operation of FIG. 8B;

DETAILED DESCRIPTION

Figure 1:
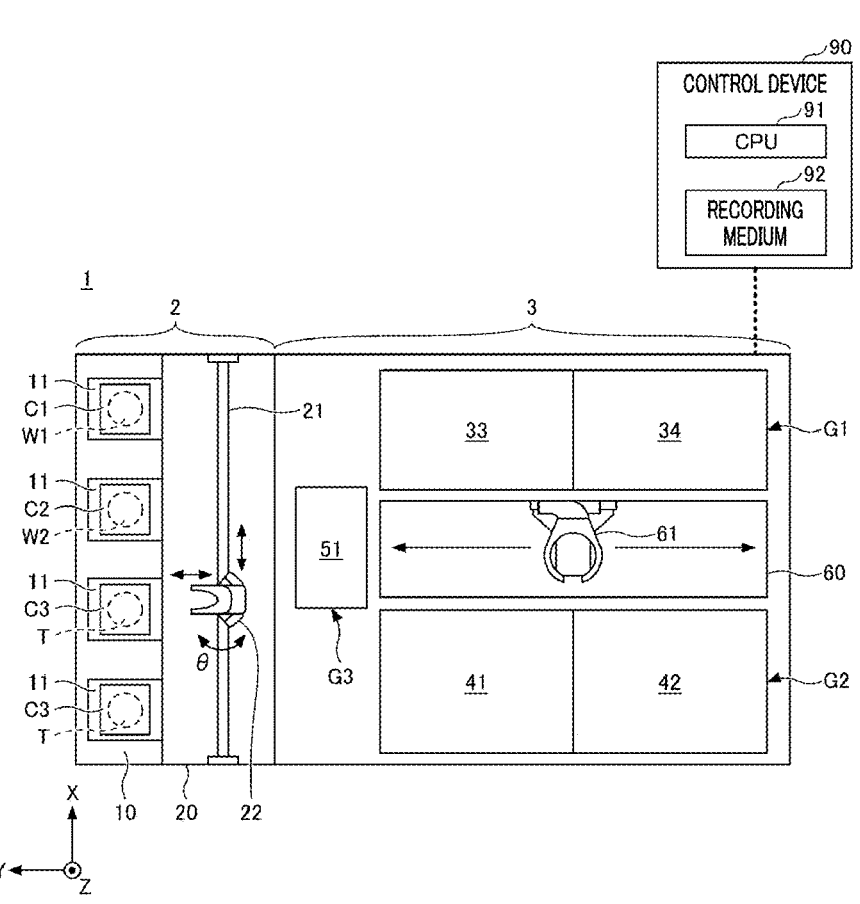
FIG. 1 is a plan view illustrating a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, embodiments of the present disclosure will be described in detail with reference to the accompanying drawings. In the various drawings, same or corresponding parts will be assigned same reference numerals, and redundant description will be omitted. Further, the X-axis direction, the Y-axis direction and the Z-axis direction are orthogonal to each other. The X-axis and Y-axis directions are horizontal directions, and the Z-axis direction is a vertical direction First, a configuration of a boding system 1 according to an exemplary embodiment will be described with reference to FIG. 1 and FIG. 2. The bonding system 1 forms a combined substrate T by bonding a first substrate W1 and a second substrate W2 shown in FIG. 3. At least one of the first substrate W1 and the second substrate W2 is, for example, a semiconductor substrate such as a silicon wafer or a compound semiconductor wafer on which a plurality of devices is formed. The devices include electronic circuits. Either one of the first substrate W1 and the second substrate W2 may be a bare wafer on which no device is formed. The first substrate W1 and the second substrate W2 have substantially the same diameter. Although not particularly limited, the compound semiconductor wafer may be a GaAs wafer, a SiC wafer, a GaN wafer, or an InP wafer. Further, instead of the semiconductor substrate, a glass substrate may be used.

Figure 3:
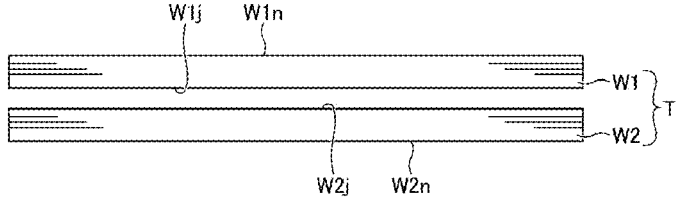
FIG. 3 is a side view illustrating an example of a first substrate and a second substrate.

In the following, the first substrate W1 may sometimes be referred to as "upper wafer W1"; the second substrate W2, "lower wafer W2"; and the combined substrate T, "combined wafer T." As shown in FIG. 3, among plate surfaces of the upper wafer W1, a plate surface to be bonded to the lower wafer W2 will be referred to as "bonding surface W1_j_", and a plate surface opposite to the bonding surface W1_j_ will be referred to as "non-bonding surface W1_n_". Further, among plate surfaces of the lower wafer W2, a plate surface to be bonded to the upper wafer W1 will be referred to as "bonding surface W2_j_", and a plate surface opposite to the bonding surface W2_j_ will be referred to as "non-bonding surface W2_n_."

As depicted in FIG. 1, the bonding system 1 includes a carry-in/out station 2 and a processing station 3. The carry-in/out station 2 and the processing station 3 are arranged in the order of the carry-in/out station 2 and the processing station 3 along the negative Y-axis direction. Further, the carry-in/out station 2 and the processing station 3 are connected as one body.

The carry-in/out station 2 includes a placing table 10 and a transfer section 20. The placing table 10 is equipped with a multiple number of placing plates 11. Respectively provided on the placing plates 11 are cassettes C1, C2, and C3 each of which accommodates therein a plurality (e.g., 25 sheets) of substrates horizontally. The cassette C1 accommodates therein a plurality of upper wafers W1; the cassette C2, a plurality of lower wafers W2; and the cassette C3, a plurality of combined wafers T. In the cassette C1 (C2), the upper wafers W1 (lower wafers W2) are accommodated while being aligned in direction with their bonding surfaces W1_j_ (W2_j_) facing upwards.

The transfer section 20 is provided adjacent to the negative Y-axis side of the placing table 10. Provided in this transfer section 20 are a transfer path 21 extending in the X-axis direction and a transfer device 22 configured to be movable along the transfer path 21. The transfer device 22 is configured to be movable in the Y-axis direction as well as in the X-axis direction and pivotable around the Z-axis, and serves to transfer the upper wafer W1, the lower wafer W2, and the combined wafer T between the cassettes C1 to C3 placed on the placing table 10 and a third processing block G3 of the processing station 3 to be described later.

In addition, the number of the cassettes C1 to C3 placed on the placing table 10 is not limited to the illustrated example. Moreover, a cassette for collecting a defective substrate may also be provided on the placing table 10 in addition to the cassettes C1, C2, and C3.

The processing station 3 is equipped with, for example, three processing blocks G1, G2 and G3. By way of example, the first processing block G1 is disposed on the rear side (positive X-axis side of FIG. 1) of the processing station 3, and the second processing block G2 is provided on the front side (negative X-axis side of FIG. 1) of the processing station 3. Further, the third processing block G3 is disposed on the carry-in/out station 2 side (positive Y-axis side of FIG. 1) of the processing station 3.

Further, a transfer region 60 is formed in an area surrounded by the first to third processing blocks G1 to G3. In the transfer region 60, a transfer device 61 is disposed. The transfer device 61 has a transfer arm configured to be movable in a vertical direction and a horizontal direction and pivotable around a vertical axis, for example.

The transfer device 61 moves within the transfer region 60 and transfers the upper wafer W1, the lower wafer W2 and the combined wafer T to preset apparatuses within the first to third processing blocks G1 to G3 adjacent to the transfer region 60.

Provided in the first processing block G1 are, for example, a surface modifying apparatus 33 and a surface hydrophilizing apparatus 34. The surface modifying apparatus 33 is configured to modify the bonding surface W1_j_ of the upper wafer W1 and the bonding surface W2_j_ of the lower wafer W2. The surface hydrophilizing apparatus 34 is configured to hydrophilize the modified bonding surfaces W1_j_ and W2_j_ of the upper and lower wafers W1 and W2.

For example, the surface modifying apparatus 33 cuts a $SiO_2$ bond on the bonding surfaces W1_j_ and W2_j_ to form a dangling bond of Si, thus enabling the bonding surfaces W1_j_ and W2_j_ to be hydrophilized afterwards. In the surface modifying apparatus 33, an oxygen gas as a processing gas is excited into plasma to be ionized under, for example, a decompressed atmosphere. As oxygen ions are radiated to the bonding surface W1_j_ of the upper wafer W1 and the bonding surface W2_j_ of the lower wafer W2, the bonding surfaces W1_j_ and W2_j_ are modified by being plasma-processed. The processing gas is not limited to the oxygen gas and may be, by way of non-limiting example, a nitrogen gas or the like.

The surface hydrophilizing apparatus 34 hydrophilizes the bonding surface W1_j_ of the upper wafer W1 and the bonding surface W2_j_ of the lower wafer W2 with, for example, a hydrophilizing liquid such as pure water. To elaborate, the surface hydrophilizing apparatus 34 supplies the pure water onto the upper wafer W1 or the lower wafer W2 while rotating the upper wafer W1 or the lower wafer W2 held by, for example, a spin chuck. The pure water is diffused on the bonding surfaces W1_j_ and W2_j_ by a centrifugal force, and imparts an OH group to the dangling bond of Si, thus allowing the bonding surfaces W1_j_ and W2_j_ to be hydrophilized. The surface hydrophilizing apparatus 34 also has a function of cleaning the bonding surfaces W1_j_ and W2_j_.

In the second processing block G2, a bonding apparatus 41, a first temperature adjusting apparatus 42, and a second temperature adjusting apparatus 43 are disposed, for example. The boning apparatus 41 is configured to form the combined wafer T by bonding the hydrophilized upper and lower wafers W1 and W2. The first temperature adjusting apparatus 42 is configured to adjust a temperature distribution of the upper wafer W1 before the upper wafer W1 is bonded, that is, before it is brought into contact with the lower wafer W2. The second temperature adjusting apparatus 43 is configured to adjust a temperature distribution of the lower wafer W2 before the lower wafer W2 is bonded, that is, before it is brought into contact with the upper wafer W1. In addition, in the present exemplary embodiment, although the first temperature adjusting apparatus 42 and the second temperature adjusting apparatus 43 are provided separately from the bonding apparatus 41, they may be configured as a part of the bonding apparatus 41.

Figure 2:
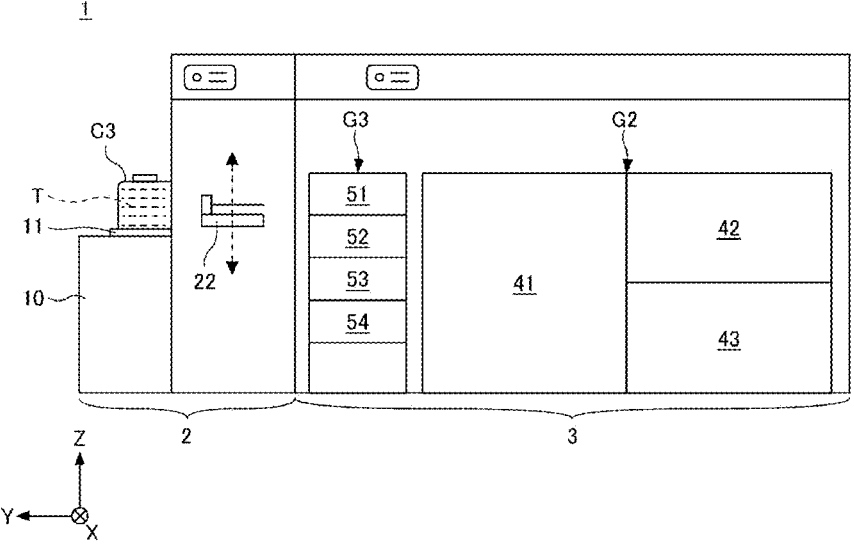
FIG. 2 is a side view of the bonding system of FIG. 1.

In the third processing block G3, a first position adjusting apparatus 51, a second position adjusting apparatus 52, and transition apparatuses 53 and 54 are stacked in this order from top to bottom, for example (see FIG. 2). The location of the individual apparatuses in the third processing block G3 is not limited to the example shown in FIG. 2. The first position adjusting apparatus 51 adjusts the direction of the upper wafer W1 in the horizontal direction by rotating the upper wafer W1 about a vertical axis, and vertically inverts the upper wafer W1 so that the bonding surface W1j of the upper wafer W1 faces down. The second position adjusting apparatus 52 adjusts the direction of the lower wafer W2 in the horizontal direction by rotating the lower wafer W2 about a vertical axis. In the transition apparatus 53, the upper wafer W1 is temporarily disposed. Further, in the transition apparatus 54, the lower wafer W2 and the combined wafer T are temporarily disposed. In addition, in the present exemplary embodiment, although the first position adjusting apparatus 51 and the second position adjusting apparatus 52 are provided separately from the bonding apparatus 41, they may be configured as a part of the bonding apparatus 41.

The bonding system 1 is equipped with a control device 90. The control device 90 is, for example, a computer, and includes a CPU (Central Processing Unit) 91 and a recording medium 92 such as a memory. The recording medium 92 stores therein a program for controlling various kinds of processings performed in the bonding system 1. The control device 90 controls the operation of the bonding system 1 by causing the CPU 91 to execute the program stored in the recording medium 92.

Figure 4:
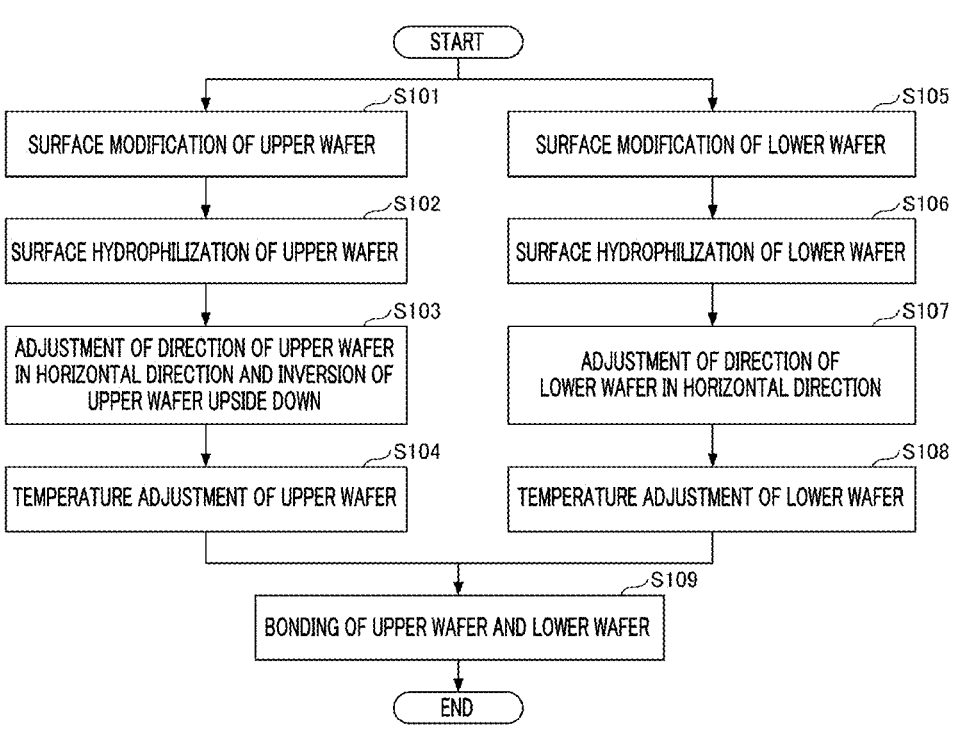
FIG. 4 is a flowchart showing a bonding method according to the exemplary embodiment.

Now, referring to FIG. 4, a bonding method according to the present exemplary embodiment will be described. The bonding method includes, for example, processes S101 to S109. The processes S101 to S109 are performed under the control of the control device 90. Further, the bonding method may not include all of the processes S101 to S109. For example, the processes S104 and S108 may be omitted. Furthermore, the bonding method may include other processes in addition to the processes S101 to S109.

First, the cassette C1 accommodating the plurality of upper wafers W1, the cassette C2 accommodating the plurality of lower wafers W2, and the empty cassette C3 are placed on the placing table 10 of the carry-in/out station 2.

Subsequently, the transfer device 22 takes out the upper wafer W1 from the cassette C1, and transfers it to the transition apparatus 53 of the third processing block G3 of the processing station 3. Thereafter, the transfer device 61 takes out the upper wafer W1 from the transition apparatus 53, and transfers it to the surface modifying apparatus 33 of the first processing block G1.

Next, the surface modifying apparatus 33 modifies the bonding surface W1j of the upper wafer W1 (process S101). The modification of the bonding surface W1j is performed in the state that the bonding surface W1j faces upwards. Thereafter, the transfer device 61 takes out the upper wafer W1 from the surface modifying apparatus 33, and transfers it to the surface hydrophilizing apparatus 34.

Afterwards, the surface hydrophilizing apparatus 34 hydrophilizes the bonding surface W1j of the upper wafer W1 (process S102). The hydrophilization of the bonding surface W1j is performed in the state that the bonding surface W1j faces upwards. Thereafter, the transfer device 61 takes out the upper wafer W1 from the surface hydrophilizing apparatus 34, and transfers it to the first position adjusting apparatus 51 of the third processing block G3.

Next, the first position adjusting apparatus 51 adjusts the direction of the upper wafer W1 in the horizontal direction by rotating the upper wafer W1 about the vertical axis, and inverts the upper wafer W1 upside down (process S103). As a result, a notch of the upper wafer W1 is directed toward a predetermined direction, and the bonding surface W1j of the upper wafer W1 is directed downwards. Thereafter, the transfer device 61 takes out the upper wafer W1 from the first position adjusting apparatus 51, and transfers it to the first temperature adjusting apparatus 42 of the second processing block G2.

Then, the first temperature adjusting apparatus 42 adjusts the temperature of the upper wafer W1 (process S104). The temperature adjustment of the upper wafer W1 is performed in the state that the bonding surface W1j of the upper wafer W1 faces downwards. Thereafter, the transfer device 61 takes out the upper wafer W1 from the first temperature adjusting apparatus 42, and transfers it to the bonding apparatus 41.

In parallel with the above-described processing on the upper wafer W1, the following processing for the lower wafer W2 is performed. First, the transfer device 22 takes out the lower wafer W2 from the cassette C2, and transfers it to the transition apparatus 54 of the third processing block G3 of the processing station 3. Thereafter, the transfer device 61 takes out the lower wafer W2 from the transition apparatus 54, and transfers it to the surface modifying apparatus 33 of the first processing block G1.

Then, the surface modifying apparatus 33 modifies the bonding surface W2j of the lower wafer W2 (process S105). The modification of the bonding surface W2j is performed in the state that the bonding surface W2j faces upwards. Thereafter, the transfer device 61 takes out the lower wafer W2 from the surface modifying apparatus 33, and transfers it to the surface hydrophilizing apparatus 34.

Subsequently, the surface hydrophilizing apparatus 34 hydrophilizes the bonding surface W2j of the lower wafer W2 (process S106). The hydrophilization of the bonding surface W2j is performed in the state that the bonding surface W2j faces upwards. Thereafter, the transfer device 61 takes out the lower wafer W2 from the surface hydrophilizing apparatus 34, and transfers it to the second position adjusting apparatus 52 of the third processing block G3.

Next, the second position adjusting apparatus 52 adjusts the direction of the lower wafer W2 in the horizontal direction by rotating the lower wafer W2 about the vertical axis (process S107). As a result, a notch of the lower wafer W2 is directed toward a predetermined direction. Thereafter, the transfer device 61 takes out the lower wafer W2 from the second position adjusting apparatus 52, and transfers it to the second temperature adjusting apparatus 43 of the second processing block G2.

Afterwards, the second temperature adjusting apparatus 43 adjusts the temperature of the lower wafer W2 (process S108). The temperature adjustment of the lower wafer W2 is performed in the state that the bonding surface W2j of the lower wafer W2 faces upwards. Thereafter, the transfer device 61 takes out the lower wafer W2 from the second temperature adjusting apparatus 43, and transfers it to the bonding apparatus 41.

Next, the bonding apparatus 41 bonds the upper wafer W1 and the lower wafer W2 to produce the combined wafer T (process S109). Thereafter, the transfer device 61 takes out the combined wafer T from the bonding apparatus 41, and transfers it to the transition apparatus 54 of the third processing block G3.

Finally, the transfer device 22 takes out the combined wafer T from the transition apparatus 54, and transfers it to the cassette C3 on the placing table 10. Accordingly, the series of processes are ended.

Figure 5:
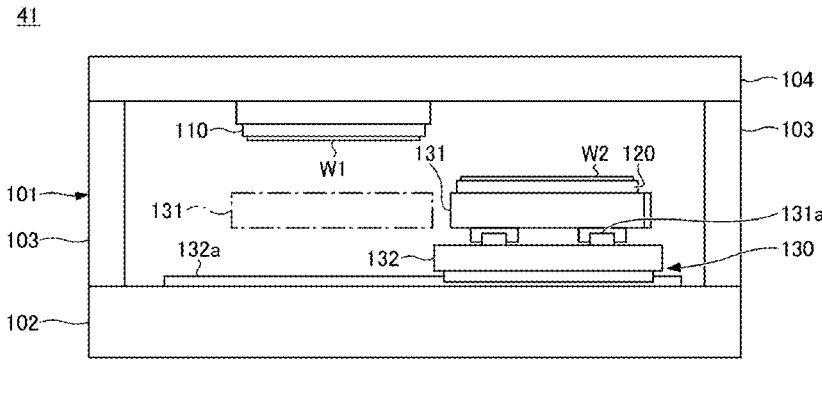
FIG. 5 is a side view illustrating an example of a bonding apparatus.
Figure 5:
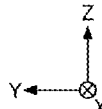

Now, referring to FIG. 5, an example of the bonding apparatus 41 will be described. As depicted in FIG. 5, the bonding apparatus 41 is equipped with, for example, a support frame 101, an upper chuck 110, a lower chuck 120, and a moving unit 130. The upper chuck 110 corresponds to a first holder described in the claims, and the lower chuck 120 corresponds to a second holder described in the claims.

The support frame 101 supports, for example, the upper chuck 110, the lower chuck 120, and the moving unit 130. The support frame 101 includes a placing table 102, a plurality of supporting columns 103 uprightly disposed on a top surface of the placing table 102, and an upper frame 104 fixed to upper ends of the plurality of supporting columns 103.

The upper frame 104 supports the upper chuck 110 from above. The upper chuck 110 attracts and holds the upper wafer W1 from above. Meanwhile, the lower chuck 120 is provided below the upper chuck 110, and attracts and holds the lower wafer W2 from below.

The moving unit 130 moves the upper chuck 110 and the lower chuck 120 relative to each other. By way of example, the moving unit 130 includes a first moving unit 131 for moving the lower chuck 120 in the X-axis direction. In addition, the moving unit 130 includes a second moving unit 132 for moving the lower chuck 120 in the Y-axis direction.

The first moving unit 131 is configured to be moved along a pair of first rails 131*a* extending in the X-axis direction. The pair of first rails 131*a* are provided on a top surface of the second moving unit 132. The moving unit 130 moves the lower chuck 120 in the X-axis direction by moving the first moving unit 131 in the X-axis direction.

The second moving unit 132 is configured to be moved along a pair of second rails 132*a* extending in the Y-axis direction. A pair of second rails 132*a* are provided on a top surface of the placing table 102. The moving unit 130 moves the first moving unit 131 and the lower chuck 120 in the Y-axis direction by moving the second moving unit 132 in the Y-axis direction.

The lower chuck 120 is mounted to the first moving unit 131, and is moved in the X-axis direction and the Y-axis direction along with the first moving unit 131. Further, the first moving unit 131 may be configured to move the lower chuck 120 in a vertical direction. Also, the first moving unit 131 may be configured to rotate the lower chuck 120 around a vertical axis. The rotation direction around the vertical axis will sometimes be referred to as θ direction.

The moving unit 130 moves the lower chuck 120 in the X-axis direction, the Y-axis direction and the θ direction, thus allowing the upper wafer W1 held by the upper chuck 110 and the lower wafer W2 held by the lower chuck 120 to be aligned in the horizontal direction. In addition, the moving unit 130 moves the lower chuck 120 in the Z-axis direction, thus allowing the upper wafer W1 held by the upper chuck 110 and the lower wafer W2 held by the lower chuck 120 to be aligned in the vertical direction.

Further, the moving unit 130 just needs to move the upper chuck 110 and the lower chuck 120 relative to each other in the X-axis direction, the Y-axis direction, and the θ direction. By way of example, the moving unit 130 may move the upper chuck 110 in the X-axis direction, the Y-axis direction, and the θ direction. Alternatively, the moving unit 130 may move the lower chuck 120 in the X-axis and Y-axis directions, while moving the upper chuck 110 in the θ direction.

The moving unit 130 moves the relative positions of the upper chuck 110 and the lower chuck 120 between a substrate transfer position and a bonding position. The substrate transfer position is a position where the upper chuck 110 receives the upper wafer W1 from the transfer device 61, the lower chuck 120 receives the lower wafer W2 from the transfer device 61, and the lower chuck 120 hands the combined wafer T over to the transfer device 61. The substrate transfer position is a position where a carry-out of the combined wafer T produced by the $n^{th}$ (n is a natural number equal or larger than 1) bonding and a carry-in of the upper wafer W1 and the lower wafer W2 to be bonded by the $(n+1)^{th}$ bonding are performed in succession.

The transfer device 61 advances into a space directly under the upper chuck 110 when it passes the upper wafer W1 to the upper chuck 110. Further, when the transfer device 61 receives the combined wafer T from the lower chuck 120 and passes the lower wafer W2 to the lower chuck 120, the transfer device 61 advances into a space directly above the lower chuck 120. The upper chuck 110 and the lower chuck 120 are set aside so that the transfer device 61 can easily advance into the space therebetween, and, further, the distance between the upper chuck 110 and the lower chuck 120 in the vertical direction is set to be large.

Meanwhile, the bonding position is a position where the upper wafer W1 and the lower wafer W2 are made to face each other at a predetermined distance therebetween to be bonded to each other. For example, the bonding position is a position shown in FIG. 9. At the bonding position, a distance G between the upper wafer W1 and the lower wafer W2 in the vertical direction is narrow, as compared to that at the substrate transfer position. Further, unlike at the substrate transfer position, the upper wafer W1 and the lower wafer W2 are overlapped at the bonding position when viewed from the vertical direction.

Figure 6:
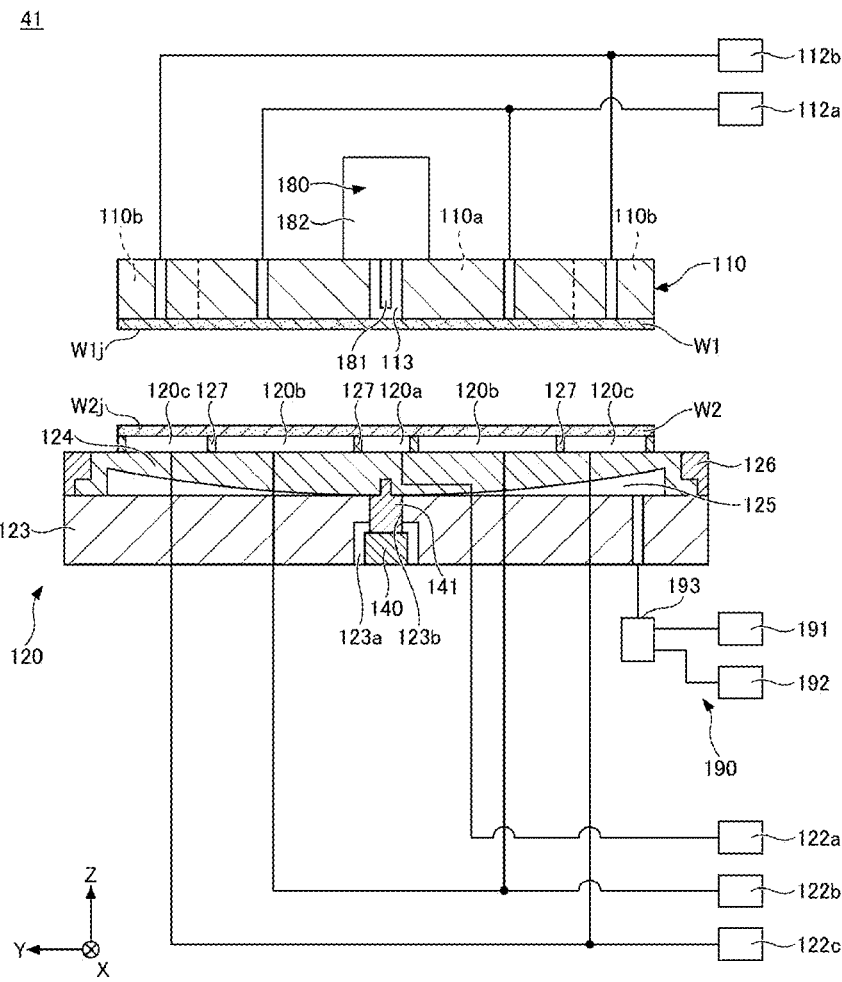
FIG. 6 is a cross sectional view illustrating an example of an upper chuck and a lower chuck.
Figure 7:
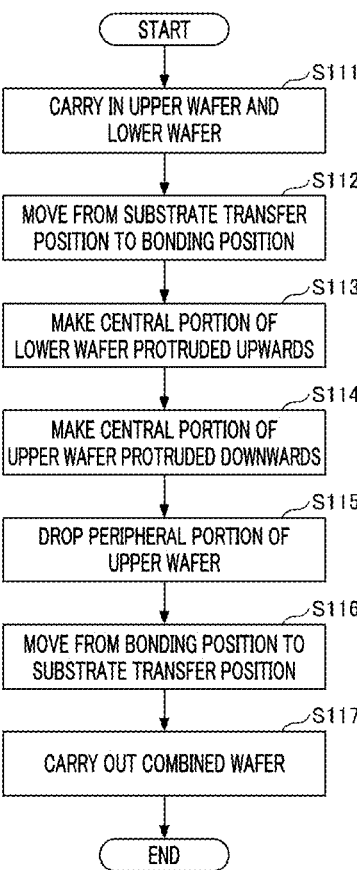
FIG. 7 is a flowchart illustrating details of a process S109 of FIG. 4.

Now, referring to FIG. 6, the upper chuck 110 and the lower chuck 120 will be described. The upper chuck 110 is divided into a plurality of (e.g., two) regions 110*a* and 110*b* in the diametrical direction thereof. These regions 110*a* and 110*b* are provided in this order from the center toward the periphery of the upper chuck 110. When viewed from the top, the region 110*a* has a circular shape, and the region 110*b* has an annular shape. Separate vacuum pumps 112*a* and 112*b* are connected to the regions 110*a* and 110*b*, respectively. The upper chuck 110 is capable of vacuum-attracting the upper wafer W1 for each of the regions 110*a* and 110*b*. The upper chuck 110 vacuum-attracts the upper wafer W1 horizontally by the operation of the vacuum pumps 112*a* and 112*b*.

The bonding apparatus 41 includes a first transforming unit 180 configured to transform the upper wafer W1 held by the upper chuck 110 so that the central portion of the upper wafer W1 is protruded downwards. The first transforming unit 180 includes, by way of example, a push pin 181, and a driving unit 182 configured to move the push pin 181 up and down. The push pin 181 is inserted through a through hole 113 which is vertically formed through the central portion of the upper chuck 110. The driving unit 182 lowers the push pin 181, thus allowing the central portion of the upper wafer W1 to be protruded downwards. The central portion of the upper wafer W1 is protruded below a peripheral portion of the upper wafer W1. A protruding amount ΔZ1 (see FIG. 11) of the central portion of the upper wafer W1 can be adjusted by controlling the position of the push pin 181.

The lower chuck 120 is divided into a plurality of (e.g., three) regions 120a, 120b, and 120c in the diametrical direction thereof. These regions 120a, 120b and 120c are provided in this order from the center toward the periphery of the lower chuck 120. When viewed from the top, the region 120a has a circular shape, and the regions 120b and 120c have an annular shape. Separate vacuum pumps 122a, 122b and 122c are connected to the regions 120a, 120b, and 120c, respectively. The lower chuck 120 is capable of vacuum-attracting the lower wafer W2 for each of the regions 120a, 120b and 120c. The lower chuck 120 vacuum-attracts the lower wafer W2 horizontally by the operation of the vacuum pumps 122a, 122b and 122c.

The lower chuck 120 includes, for example, a base 123 and an attraction unit 124. The attraction unit 124 is provided on the base 123, and attracts and holds the lower wafer W2 from below. When viewed from above, the attraction unit 124 has, for example, a circular shape. A fastening ring 126 is provided around the attraction unit 124. The periphery of the attraction unit 124 is fixed to the base 123 by the fastening ring 126. A pressure-variable space 125 is formed between a top surface of the base 123 and a bottom surface of the attraction unit 124. This pressure-variable space 125 is hermetically sealed.

Figure 16:
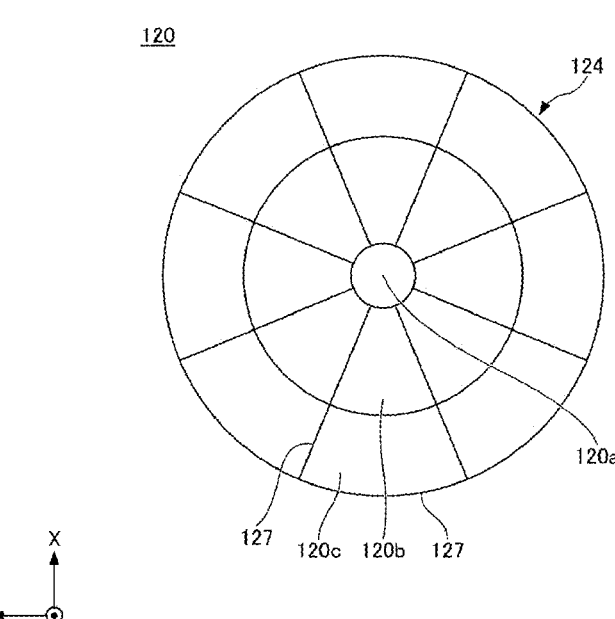
FIG. 16 is a plan view illustrating an example of an attraction surface of the lower chuck.

The attraction unit 124 has a circular top surface whose diameter is larger than that of the lower wafer W2. Ribs 127 are provided on the top surface of the attraction unit 124. The ribs 127 serve to separate the plurality of regions 120a, 120b and 120c. The ribs 127 may divide the annular regions 120b and 120c into a plurality of (e.g., eight) sector-shaped sub-regions along the circumferential direction (see FIG. 16). An attracting pressure for the lower wafer W2 can be varied for each sub-region. In addition, the number and the layout of the ribs 127 are not limited to those shown in FIG. 16.

The bonding apparatus 41 is equipped with a second transforming unit 190 configured to transform the lower wafer W2 held by the lower chuck 120, thus allowing the central portion of the lower wafer W2 to be protruded upwards. The second transforming unit 190 elastically transforms the attraction unit 124 by changing a pressure in the pressure-variable space 125. The attraction unit 124 is made of, for example, ceramic such as alumina or silicon carbide. The second transforming unit 190 includes a vacuum pump 191 and an electro-pneumatic regulator 192. The second transforming unit 190 may also be provided with a switching valve 193.

The vacuum pump 191 decompresses the pressure-variable space 125 by exhausting a gas in the pressure-variable space 125. Due to the decompression of the pressure-variable space 125, the top surface of the attraction unit 124 becomes a horizontal plane, so that the lower wafer W2 attracted by the attraction unit 124 becomes horizontal. The electro-pneumatic regulator 192 pressurizes the pressure-variable space 125 by supplying a gas into the pressure-variable space 125. Due to the pressurization of the pressure-variable space 125, the top surface of the attraction unit 124 becomes an upwardly protruding curved surface, so that the lower wafer W2 attracted by the attraction unit 124 is protruded upwards. The switching valve 193 switches the pressure-variable space 125 between a state in which it is connected to the vacuum pump 191 and a state in which it is connected to the electro-pneumatic regulator 192.

The second transforming unit 190 pressurizes the pressure-variable space 125 to allow the central portion of the lower wafer W2 held by the lower chuck 120 to be protruded upwards. The central portion of the lower wafer W2 is protruded above a peripheral portion of the lower wafer W2. A protruding amount ΔZ2 (see FIG. 10) of the central portion of the lower wafer W2 can be adjusted by controlling the pressure of the pressure-variable space 125.

A measuring unit 140 measures the protruding amount ΔZ2 of the central portion of the lower wafer W2. A measurement target 141 of the measuring unit 140 is moved up and down along with the central portion of the lower wafer W2. The measuring unit 140 is, for example, an electrostatic capacitance sensor. The electrostatic capacitance sensor measures the protruding amount ΔZ2 by detecting electrostatic capacitance that varies according to a distance from the measurement target 141. The base 123 has an accommodation space 123a in which the measuring unit 140 is accommodated, and an insertion hole 123b into which the measurement target 141 is inserted. The accommodation space 123a and the insertion hole 123b are formed in the center of the base 123. The measurement target 141 is fixed to the center of the bottom surface of the attraction unit 124, and is moved up and down within the insertion hole 123b.

Now, referring to FIG. 7 to FIG. 14, details of the process S109 in FIG. 4 will be explained. First, the transfer device 61 carries the upper wafer W1 and the lower wafer W2 into the bonding apparatus 41 (process S111). In the process S111, the relative positions of the upper chuck 110 and the lower chuck 120 are set at the substrate transfer position shown in FIG. 5. The upper chuck 110 attracts and holds the upper wafer W1 horizontally from above, and the lower chuck 120 attracts and holds the lower wafer W2 horizontally from below.

Figure 9:
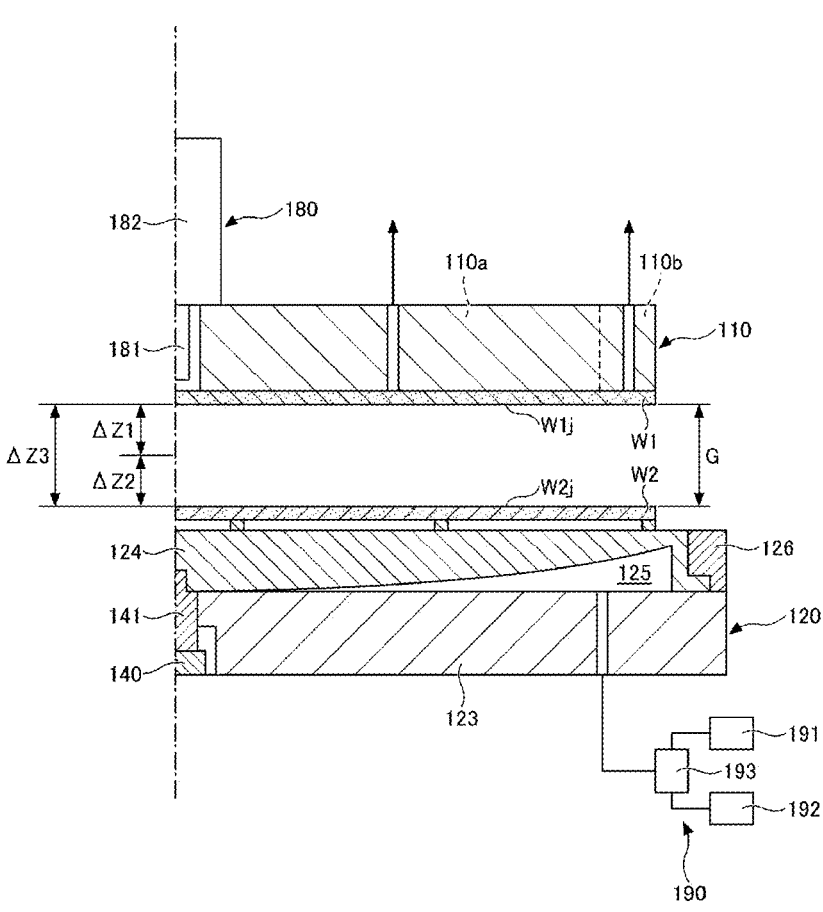
FIG. 9 is a cross sectional view illustrating an example of a state upon the completion of the process S112.

Then, the moving unit 130 moves the relative positions of the upper chuck 110 and the lower chuck 120 from the substrate transfer position shown in FIG. 5 to the bonding position shown in FIG. 9 (process S112). In the process S112, the upper wafer W1 and the lower wafer W2 are aligned. For this alignment, a first camera S1 and a second camera S2 are used, as illustrated in FIG. 8A to FIG. 8C.

The first camera S1 is fixed to the upper chuck 110, and serves to image the lower wafer W2 held by the lower chuck 120. A plurality of reference points P21 to P23 are previously formed on the bonding surface W2j of the lower wafer W2. As these reference points P21 to P23, patterns such as electronic circuits are used. The number of the reference points can be set as required.

Meanwhile, the second camera S2 is fixed to the lower chuck 120, and serves to image the upper wafer W1 held by the upper chuck 110. A plurality of reference points P11 to P13 are previously formed on the bonding surface W1j of the upper wafer W1. As these reference points P11 to P13, patterns such as an electronic circuits are used. The number of the reference points can be set as required.

First, as shown in FIG. 8A, the moving unit 130 adjusts the relative positions of the first camera S1 and the second camera S2 in the horizontal direction. To elaborate, the moving unit 130 moves the lower chuck 120 in the horizontal direction so that the second camera S2 is located approximately directly under the first camera S1. Then, the first camera S1 and the second camera S2 image a common target X, and the moving unit 130 finely adjusts the position of the second camera S2 in the horizontal direction so that the positions of the first camera S1 and the second camera S2 in the horizontal direction are coincident. Accordingly, the alignment of the first camera S1 and the second camera S2 is completed.

Subsequently, as shown in FIG. 8B, the moving unit 130 moves the lower chuck 120 vertically upwards, and, then, adjusts the positions of the upper chuck 110 and the lower chuck 120 in the horizontal direction. To elaborate, while the moving unit 130 is moving the lower chuck 120 in the horizontal direction, the first camera S1 images the reference points P21 to P23 of the lower wafer W2 in sequence, and the second camera S2 images the reference points P11 to P13 of the upper wafer W1 in sequence. FIG. 8B shows a state in which the first camera S1 is imaging the reference point P21 of the lower wafer W2 and the second camera S2 is imaging the reference point P11 of the upper wafer W1.

The first camera S1 and the second camera S2 transmit the obtained image data to the control device 90. The control device 90 controls the moving unit 130 based on the image data obtained by the first camera S1 and the image data obtained by the second camera S2, and adjusts the position of the lower chuck 120 in the horizontal direction so that the reference points P11 to P13 of the upper wafer W1 and the reference points P21 to P23 of the lower wafer W2 are matched.

Thereafter, as depicted in FIG. 8C, the moving unit 130 moves the lower chuck 120 vertically upwards. As a result, the distance G (see FIG. 9) between the bonding surface W2j of the lower wafer W2 and the bonding surface W1j of the upper wafer W1 becomes a predetermined distance of, for example, 80 μm to 200 μm. For the adjustment of the distance G, a first displacement meter S3 and a second displacement meter S4 are used.

Like the first camera S1, the first displacement meter S3 is fixed to the upper chuck 110 and measures the thickness of the lower wafer W2 held by the lower chuck 120. By way of example, the first displacement meter S3 radiates light to the lower wafer W2, receives reflected light from the top and bottom surfaces of the lower wafer W2, and measures the thickness of the lower wafer W2. This thickness measurement is performed when the moving unit 130 moves the lower chuck 120 in the horizontal direction, for example. The method whereby the first displacement meter S3 measures the thickness is, by way of non-limiting example, a confocal method, a spectral interference method, a triangulation method, or the like. A light source of the first displacement meter S3 is an LED or a laser.

Meanwhile, the second displacement meter S4 is fixed to the lower chuck 120, the same as the second camera S2, and measures the thickness of the upper wafer W1 held by the upper chuck 110. For example, the second displacement meter S4 radiates light to the upper wafer W1, receives reflected light from the top and bottom surfaces of the upper wafer W1, and measures the thickness of the upper wafer W1. This thickness measurement is performed when the moving unit 130 moves the lower chuck 120 in the horizontal direction, for example. The method whereby the second displacement meter S4 measures the thickness is, for example, a confocal method, a spectral interference method, a triangulation method, or the like. A light source of the second displacement meter S4 is an LED or a laser.

The first displacement meter S3 and the second displacement meter S4 transmit the measured data to the control device 90. The control device 90 controls the moving unit 130 based on the data measured by the first displacement meter S3 and the data measured by the second displacement meter S4, and adjusts the position of the lower chuck 120 in the vertical direction so that the distance G becomes a set value ΔZ3 (ΔZ3=ΔZ1+ΔZ2). Here, ΔZ1 is a protruding amount of the central portion of the upper wafer W1 in a process S114, and ΔZ2 is a protruding amount of the central portion of the lower wafer W2 in a process S113.

Figure 10:
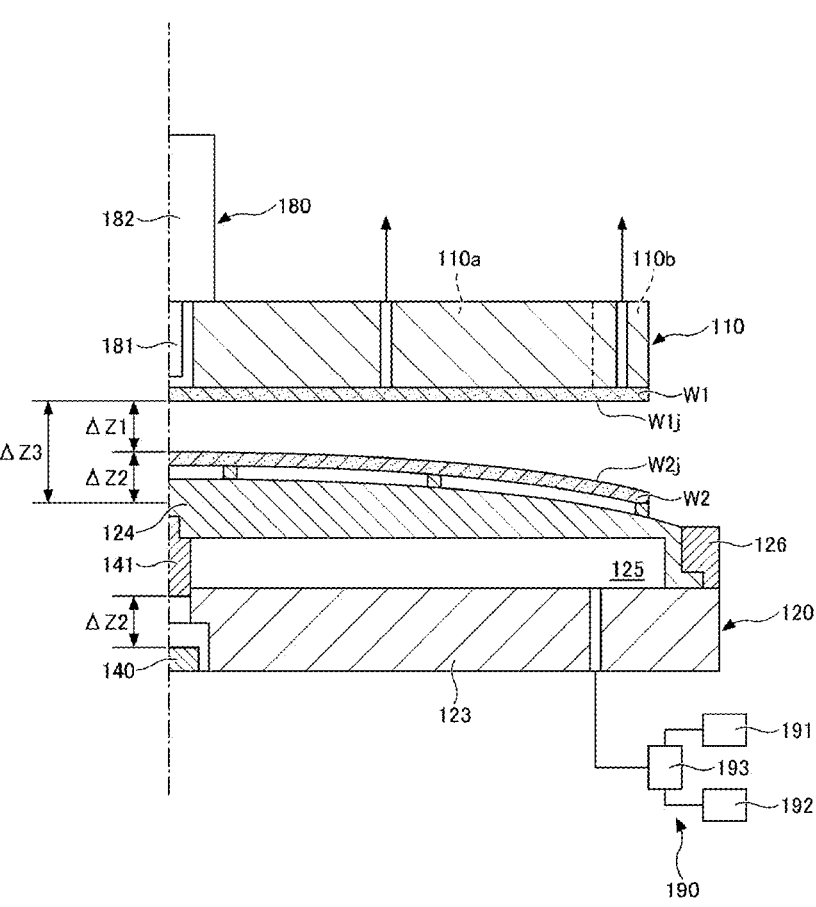
FIG. 10 is a cross sectional view illustrating an example of a state upon the completion of a process S113.

Subsequently, as shown in FIG. 10, the control device 90 controls the second transforming unit 190 to make the central portion of the lower wafer W2 protruded upwards (process S113). The control device 90 pressurizes the pressure-variable space 125, thus allowing the central portion of the lower wafer W2 held by the attraction unit 124 to be protruded upwards. The protruding amount ΔZ2 is measured by the measuring unit 140, and the pressure of the pressure-variable space 125 is controlled so that the measurement value becomes a set value.

Further, in the present exemplary embodiment, although the lower wafer W2 is transformed after it is attracted to the lower chuck 120, the lower chuck 120 may be first transformed and then the lower wafer W2 may be attracted to the lower chuck 120. In the latter case, bending precision of the lower wafer W2 can be improved, as compared to the former case, so that an unintended position deviation of the reference points P21 to P23 of the lower wafer W2 can be suppressed. Therefore, the bonding precision can be bettered.

Figure 11:
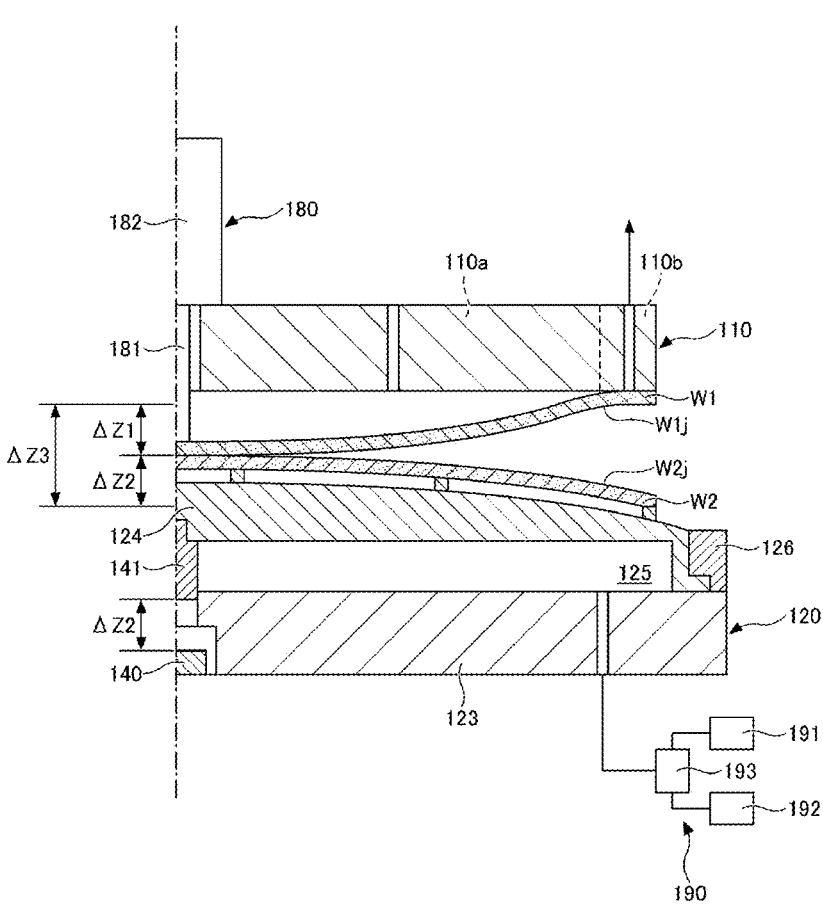
FIG. 11 is a cross sectional view illustrating an example of a state upon the completion of a process S114.

Thereafter, as illustrated in FIG. 11, the control device 90 stops the operation of the vacuum pump 112a to cancel the vacuum attraction of the upper wafer W1 in the region 110a. Thereafter, the control device 90 lowers the push pin 181 of the first transforming unit 180, thus allowing the central portion of the upper wafer W1 to be protruded downwards (process S114). As a result, the central portions of the upper wafer W1 and the lower wafer W2 come into contact with each other and are bonded to each other. Here, the order of the processes S113 and S114 may be reversed.

Since the bonding surface W1j of the upper wafer W1 and the bonding surface W2j of the lower wafer W2 are modified, a van der Waals force (intermolecular force) is first generated between the bonding surfaces W1j and W2j, so that the bonding surfaces W1j and W2j are bonded. Further, since the bonding surface W1j of the upper wafer W1 and the bonding surface W2j of the lower wafer W2 are hydrophilized, hydrophilic groups (for example, OH groups) are hydrogen-bonded, so that the bonding surfaces W1j and W2j are strongly bonded to each other.

Figure 12:
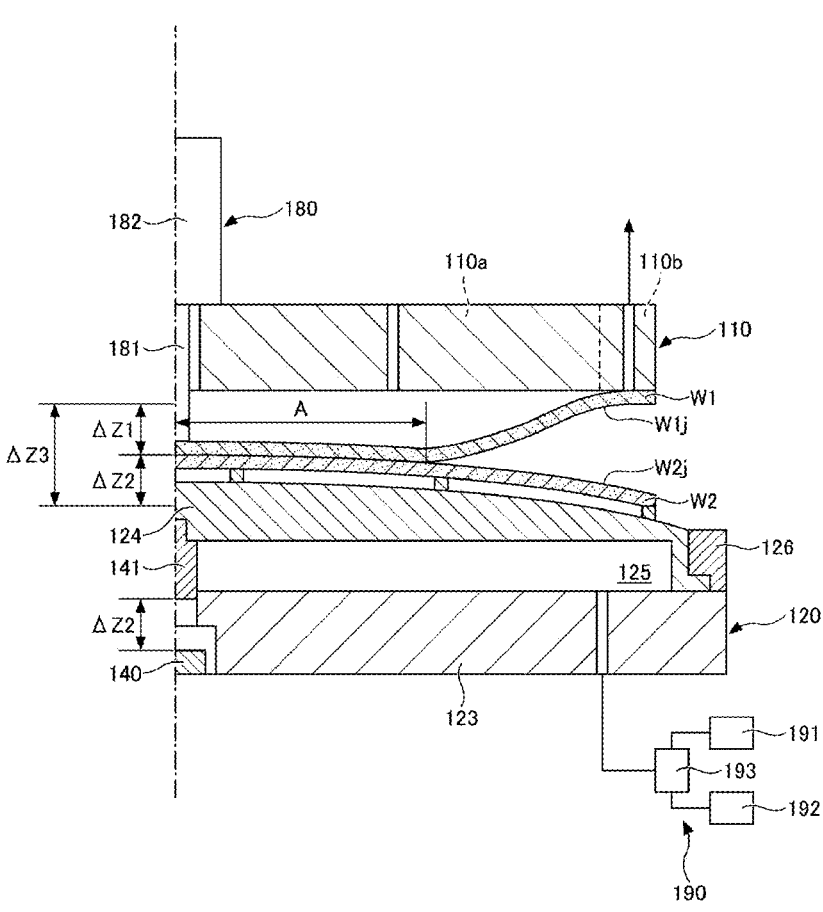
FIG. 12 is a cross sectional view illustrating an example of a state between the process S114 and a process S115.

The van der Waals force is generated even when a gap exists between the upper wafer W1 and the lower wafer W2. The narrower the gap is, the greater the van der Waals force may be. The van der Waals force makes the upper wafer W1 and the lower wafer W2 attracted to each other. Therefore, after the central portions of the upper wafer W1 and the lower wafer W2 come into contact with each other as shown in FIG. 11, a region A where they are in contact with each other is widened, as illustrated in FIG. 12. Since, however, the peripheral portion of the upper wafer W1 is attracted to and held by the upper chuck 110, the expansion of the region A temporarily stops at a certain point between the central portion and the peripheral portion of the upper wafer W1.

Figure 13:
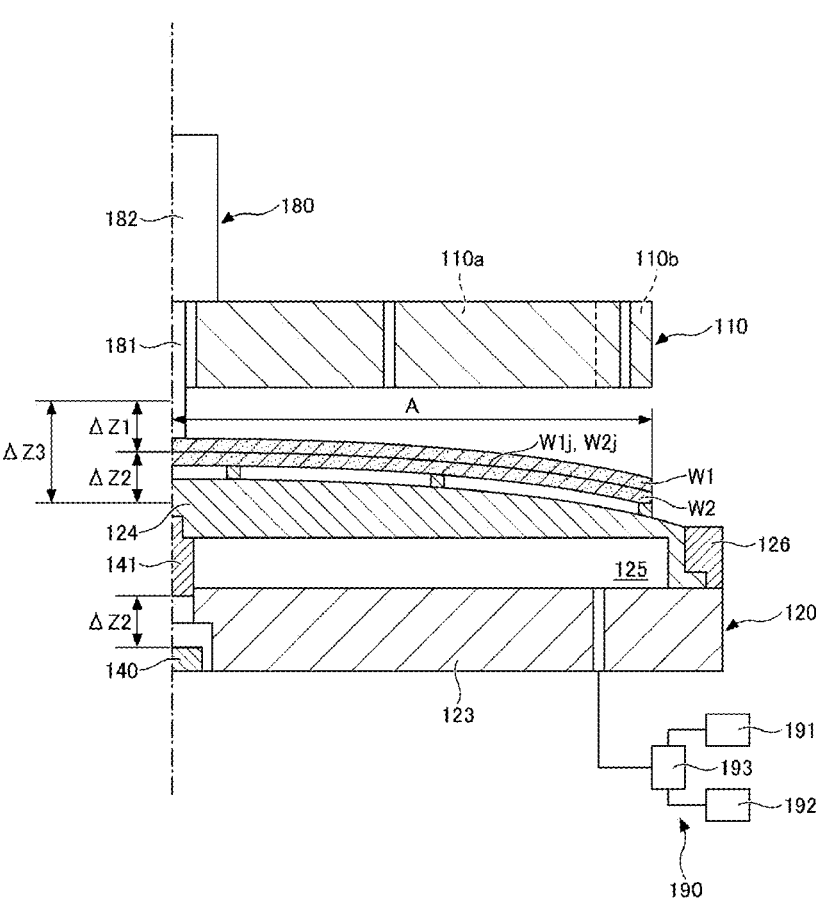
FIG. 13 is a cross sectional view illustrating an example of a state upon the completion of the process S115.

Next, as depicted in FIG. 13, the control device 90 stops the operation of the vacuum pump 112b to release the vacuum attraction of the upper wafer W1 in the region 110b, thus allowing the peripheral portion of the upper wafer W1 to fall down (process S115). As a result, the region A is expanded up to the peripheral portion, so that the entire bonding surface W1j of the upper wafer W1 and the entire bonding surface W2j of the lower wafer W2 come into contact with each other to produce the combined wafer T.

According to the present exemplary embodiment, as shown in FIG. 11, by making the central portion of the upper wafer W1 protruded below the peripheral portion of the upper wafer W1, the upper wafer W1 is bent into a downwardly protruding shape, and, also, by making the central portion of the lower wafer W2 protruded above the peripheral portion of the lower wafer W2, the lower wafer W2 is bent into an upwardly protruding shape. By bending the upper wafer W1 and the lower wafer W2 into vertically symmetrical shapes, a difference in elongation rates between the upper wafer W1 and the lower wafer W2 can be reduced. As a result, after the bonding, a deviation between the reference points P11 to P13 of the upper wafer W1 and the reference points P21 to P23 of the lower wafer W2 when viewed from the vertical direction can be reduced.

After the combined wafer T is obtained, the control device 90 raises the push pin 181 of the first transforming unit 180. Further, the control device 90 decompresses the pressure-variable space 125 of the lower chuck 120, and cancels the transformation of the lower wafer W2. The lower chuck 120 attracts and holds the combined wafer T horizontally from below.

Next, the moving unit 130 moves the relative positions of the upper chuck 110 and the lower chuck 120 from the bonding position to the substrate transfer position (process S116). For example, the moving unit 130 first lowers the lower chuck 120 to widen the distance between the lower chuck 120 and the upper chuck 110 in the vertical direction. Then, the moving unit 130 moves the lower chuck 120 sideways, and sets the lower chuck 120 and the upper chuck 110 aside.

Next, the transfer device 61 performs a carry-out of the combined wafer T with respect to the bonding apparatus 41 (process S117). Specifically, the lower chuck 120 releases the attraction and holding of the combined wafer T. Then, the transfer device 61 receives the combined wafer T from the lower chuck 120 and carries it out of the bonding apparatus 41.

By the way, the protruding amount $\Delta Z2$ of the central portion of the lower wafer W2 may be changed for the purpose of changing the elongation rate of the lower wafer W2 or the like. Here, the purpose of changing the protruding amount $\Delta Z2$ is not particularly limited. When changing the protruding amount $\Delta Z2$, if the protruding amount $\Delta Z1$ of the central portion of the upper wafer W1 is kept constant without being changed, the behavior of the expansion of the region A is changed.

For example, if $\Delta Z2$ is made smaller while $\Delta Z1$ remains the same, the sum $\Delta Z3$ of $\Delta Z1$ and $\Delta Z2$ becomes smaller. Accordingly, as shown in FIG. 11, when the central portions of the upper wafer W1 and the lower wafer W2 come into contact with each other, a gap between the peripheral portions of the upper wafer W1 and the lower wafer W2 is narrowed. The narrower the gap is, the larger the van der Waals force gets, making it easier for the region A to be expanded. Therefore, as shown in FIG. 12, the size of the region A when the expansion of the region A is temporarily stopped increases.

In this way, if $\Delta Z1$ is not changed but kept constant when $\Delta Z2$ is changed, the behavior of the expansion of the region A is changed. If the behavior of the expansion of the region A is changed, the bonding precision decreases, which may cause an increase of a deviation between the reference points P11 to P13 of the upper wafer W1 and the reference points P21 to P23 of the lower wafer W2 after the bonding, when viewed from the vertical direction.

The control device 90 of the present exemplary embodiment changes the protruding amount $\Delta Z1$ of the central portion of the upper wafer W1 according to the protruding amount $\Delta Z2$ of the central portion of the lower wafer W2. Accordingly, the behavior of the expansion of the region A can be kept constant, so that the bonding precision can be improved. The control device 90 may change the sum $\Delta Z3$ of $\Delta Z1$ and $\Delta Z2$ ($\Delta Z3 = \Delta Z1 + \Delta Z2$) according to $\Delta Z2$.

Figure 14:
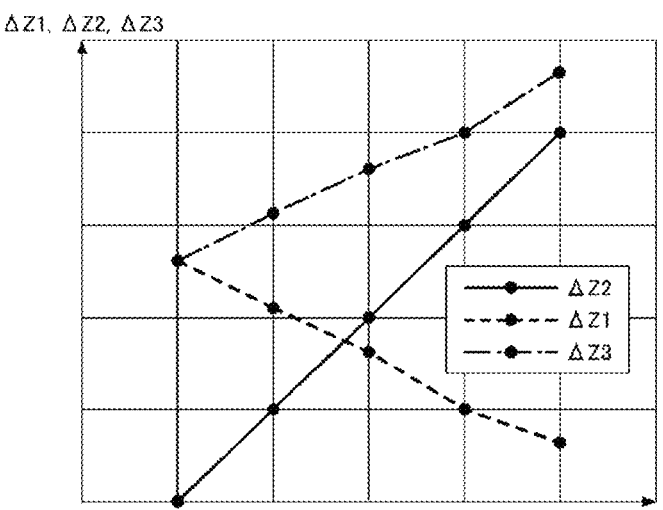
FIG. 14 is a diagram illustrating an example of a relationship between $\Delta Z1$ and $\Delta Z2$ and $\Delta Z3$.

Now, referring to FIG. 14, an example of the relationship between $\Delta Z1$, $\Delta Z2$ and $\Delta Z3$ will be discussed. The control device 90 performs, for example, a control of decreasing $\Delta Z1$ when $\Delta Z2$ increases, as shown in FIG. 14. Accordingly, it is possible to suppress a change in the sum $\Delta Z3$ of $\Delta Z1$ and $\Delta Z2$, so that the size of the region A when the expansion of the region A is temporarily stopped can be maintained constant, as illustrated in FIG. 12. Since the behavior of the expansion of the region A can be kept constant, the bonding precision can be improved.

The control device 90 may also perform a control of increasing the sum $\Delta Z3$ of $\Delta Z1$ and $\Delta Z2$ when the protruding amount $\Delta Z2$ of the central portion of the lower wafer W2 increases. When the decrease rate of $\Delta Z1$ is small as compared to the increase rate of $\Delta Z2$, $\Delta Z3$ becomes large. Thus, a change in the van der Waals force caused by the gap between the upper and lower wafers can be suppressed, so that the size of the region A when the expansion of the region A is temporarily stopped as shown in FIG. 12 can be maintained constant. Since the behavior of the expansion of the region A can be kept constant, the bonding precision can be improved.

Figure 15:
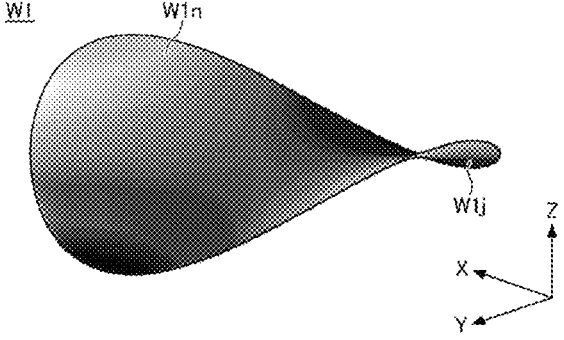
FIG. 15 is a perspective view illustrating an example of bending of an upper wafer.

The control device 90 may have a function of changing the setting of the protruding amount $\Delta Z2$ of the central portion of the lower wafer W2. By way of example, the control device 90 may acquire bending data of the upper wafer W1 under no load as shown in FIG. 15, and may change the protruding amount $\Delta Z2$ of the central portion of the lower wafer W2 according to the bending of the upper wafer W1 under no load. Here, no load means a state in which a stress on the surface of the substrate is substantially zero, for example, a state in which no attracting pressure is generated. Further, in FIG. 15, a gray scale represents a height difference. The bending of the upper wafer W1 under no load is not limited to the bending shown in FIG. 15.

A cross-sectional shape from the central portion to the peripheral portion of the upper wafer W1 when the central portions of the upper wafer W1 and the lower wafer W2 are in contact with each other as shown in FIG. 11 changes according to the bending of the upper wafer W1 under no load. Therefore, if the bending of the upper wafer W1 under no load is changed, the behavior of the expansion of the region A may be changed.

If the control device 90 changes the protruding amount $\Delta Z2$ of the central portion of the lower wafer W2 according to the bending of the upper wafer W1 under no load, the behavior of the expansion of the region A can be maintained constant, so that the bonding precision can be improved. In addition, the relationship between the bending of the upper wafer W1 under no load and the protruding amount $\Delta Z2$ of the central portion of the lower wafer W2 is determined in advance by experiments or the like and stored in the recording medium 92 in advance to be read and used later.

The bending of the upper wafer W1 under no load may be measured with a measuring device (not shown). As the measuring device, a commercially available three-dimensional shape measuring device or the like may be used. The measuring device may be provided inside the bonding system 1, or outside the bonding system 1. The measuring device transmits the measurement data of the bending to the control device 90, and the control device 90 receives the measurement data of the bending sent by the measuring device.

The control device 90 may acquire data on a position deviation of the reference points P11 to P13 formed on the bonding surface W1*j* of the upper wafer W1, and may vary the protruding amount ΔZ2 of the central portion of the lower wafer W2 according to the position deviation of the reference points P11 to P13. The position deviation of the reference points P11 to P13 may be a position deviation from target positions when the reference points P11 to P13 are formed on the bonding surface W1*j*, or may be a position deviation from the reference points P21 to P23 formed on the bonding surface W2*j* of the lower wafer W2. In the former case, the data of the position deviation is acquired from an apparatus that forms the reference points P11 to P13, for example, an apparatus that forms an electronic circuit. In the latter case, the data of the position deviation can be acquired by using the first camera S1 and the second camera S2.

Likewise, the control device 90 may acquire data on a position deviation of the reference points P21 to P23 formed on the bonding surface W2*j* of the lower wafer W2, and may vary the protruding amount ΔZ2 of the central portion of the lower wafer W2 according to the position deviation of the reference points P21 to P23. The position deviation of the reference points P21 to P23 may be a position deviation from target positions when the reference points P21 to P23 are formed on the bonding surface W2*j*, or may be a position deviation from the reference points P11 to P13 formed on the bonding surface W1*j* of the upper wafer W1. In the former case, the data of the position deviation is acquired from an apparatus that forms the reference points P21 to P23, for example, an apparatus that forms an electronic circuit. In the latter case, the data of the position deviation can be acquired by using the first camera S1 and the second camera S2.

Moreover, in order to perform the control of maintaining the behavior of the expansion of the region A constant, the control device 90 may control, besides (A) the protruding amount ΔZ1 of the central portion of the upper wafer W1 or (B) the protruding amount ΔZ2 of the central portion of the lower wafer W2, (C) an attracting force of the upper chuck 110, (D) an attracting force of the lower chuck 120, (E) a driving force for lowering the push pin 181, or the like. (D) The attracting force of the lower chuck 120 includes a distribution of the attracting pressure of the lower chuck 120.

So far, the exemplary embodiment of the substrate processing apparatus and the substrate processing method according to the present disclosure have been described. However, the present disclosure is not limited to the above-described exemplary embodiment and the like. Various changes, modifications, substitutions, additions, deletions and combinations may be made within the scope of the claims, which are all incorporated within a technical scope of the present disclosure.

According to the exemplary embodiment, it is possible to improve the bonding precision between the substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A bonding apparatus configured to bond a first substrate and a second substrate, comprising:
   a first holder configured to attract and hold the first substrate from above;
   a second holder provided below the first holder, and configured to attract and hold the second substrate under the first holder;
   a moving unit configured to move the first holder and the second holder relative to each other;
   a first transforming unit configured to make a central portion of the first substrate held by the first holder protrude downward;
   a second transforming unit configured to make a central portion of the second substrate held by the second holder protrude upward; and
   a controller and a storage storing a computer program, wherein the storage and the computer program are configured, with the controller, to control the moving unit, the first transforming unit, and the second transforming unit to perform a control of bringing the central portions of the first substrate and the second substrate into contact with each other such that the central portions of the first substrate and the second substrate are bonded to each other,
   wherein the controller performs:
   a control of changing a protruding amount of the central portion of the first substrate according to a protruding amount of the central portion of the second substrate,
   a control of decreasing the protruding amount of the central portion of the first substrate as the protruding amount of the central portion of the second substrate increases; and
   a control of changing a sum of the protruding amount of the central portion of the first substrate and the protruding amount of the central portion of the second substrate according to the protruding amount of the central portion of the second substrate.

2. The bonding apparatus of claim 1, wherein the controller performs a control of increasing the sum of the protruding amount of the central portion of the first substrate and the protruding amount of the central portion of the second substrate as the protruding amount of the central portion of the second substrate increases.

3. The bonding apparatus of claim 1,
   wherein the controller acquires data of bending of the first substrate under no load, and changes the protruding amount of the central portion of the second substrate according to the bending of the first substrate under no load.

4. The bonding apparatus of claim 1,
   wherein the controller acquires data of a position deviation of a reference point formed on a bonding surface of the first substrate or the second substrate, and changes the protruding amount of the central portion of the second substrate according to the position deviation of the reference point.

5. A bonding method of bonding a first substrate and a second substrate,
   the bonding method being performed by a controller in communication with a storage storing a computer program, the controller being configured to control steps of the bonding method comprising:

attracting and holding the first substrate from above with a first holder;

attracting and holding the second substrate from below with a second holder under the first holder;

moving the first holder and the second holder relative to each other; and making a central portion of the second substrate held by the second holder protruded upwards while making a central portion of the first substrate held by the first holder protruded downwards, to thereby bring the central portions of the first substrate and the second substrate into contact with each other such that the central portions of the first substrate and the second substrate are bonded to each other, wherein a protruding amount of the central portion of the first substrate is changed according to a protruding amount of the central portion of the second substrate, and decreasing the protruding amount of the central portion of the first substrate as the protruding amount of the central portion of the second substrate increases;

changing a sum of the protruding amount of the central portion of the first substrate and the protruding amount of the central portion of the second substrate according to the protruding amount of the central portion of the second substrate.

6. The bonding method of claim 5, further comprising:

increasing the sum of the protruding amount of the central portion of the first substrate and the protruding amount of the central portion of the second substrate as the protruding amount of the central portion of the second substrate increases.

7. The bonding method of claim 5, further comprising:

acquiring data of bending of the first substrate under no load, and changing the protruding amount of the central portion of the second substrate according to the bending of the first substrate under no load.

8. The bonding method of claim 5, further comprising:

acquiring data of a position deviation of a reference point formed on a bonding surface of the first substrate or the second substrate, and changing the protruding amount of the central portion of the second substrate according to the position deviation of the reference point.

* * * * *